US012771315B2

(12) United States Patent
Lee et al.

(10) Patent No.: US 12,771,315 B2
(45) Date of Patent: Oct. 20, 2026

(54) SURFACE ACOUSTIC WAVE DEVICE INCLUDING IDT ELECTRODES HAVING METAL OXIDE LAYER FORMED THEREON AND METHOD FOR FABRICATING THE SAME

(71) Applicant: WISOL CO., LTD., Osan-si (KR)

(72) Inventors: Hun Yong Lee, Osan-si (KR); Sang Hoon Myeong, Osan-si (KR); Chang Min Lee, Osan-si (KR); Min Hyeong Lee, Osan-si (KR)

(73) Assignee: WISOL CO., LTD., Osan-si (KR)

( * ) Notice: Subject to any disclaimer, the term of this patent is extended or adjusted under 35 U.S.C. 154(b) by 244 days.

(21) Appl. No.: 18/671,784

(22) Filed: May 22, 2024

(65) Prior Publication Data

US 2024/0396522 A1 Nov. 28, 2024

(30) Foreign Application Priority Data

May 24, 2023 (KR) ........................ 10-2023-0067063

(51) Int. Cl.
*H03H 9/145* (2006.01)
*H03H 3/10* (2006.01)
*H03H 9/25* (2006.01)

(52) U.S. Cl.
CPC .......... *H03H 9/14541* (2013.01); *H03H 3/10* (2013.01); *H03H 9/25* (2013.01)

(58) Field of Classification Search
CPC ............ H03H 9/145; H03H 9/25; H03H 9/64; H03H 9/72; H03H 3/10
See application file for complete search history.

(56) References Cited

U.S. PATENT DOCUMENTS 6,136,175 A * 10/2000 Stelzl ................. H03H 9/02937 29/25.35
6,774,542 B2 * 8/2004 Anasako ............ H03H 9/02897 310/313 R (Continued)

FOREIGN PATENT DOCUMENTS

| | | | | |
|---|---|---|---|---|
| KR | 10-2008-0040908 | 5/2008 | | |
| WO | WO-2012169452 A1 * | 12/2012 | ......... | H03H 9/14541 |
| WO | 2012169452 | 2/2015 | | |

OTHER PUBLICATIONS

Office Action for Korea Patent Application No. 10-2023-0067063, mailed Sep. 25, 2024.

*Primary Examiner* — Andrea Lindgren Baltzell
*Assistant Examiner* — Alan Wong

(57) ABSTRACT

Provided are a surface acoustic wave device including IDT electrodes having an oxide electrode layer formed therein, and a method for fabricating the same. The surface acoustic wave device include a piezoelectric substrate and a plurality of IDT electrodes formed on the piezoelectric substrate, wherein each of the plurality of IDT electrodes includes: a main electrode layer formed on the upper surface of the piezoelectric substrate; an upper electrode layer formed on the main electrode layer; and an oxide electrode layer formed on the upper surface of the upper electrode layer by oxidation of the upper electrode layer, and wherein the thickness ($t_e$) of each of the plurality of IDT electrodes satisfies $0.011 \leq t_o/t_e \leq 0.333$ with respect to the thickness ($t_o$) of the oxide electrode layer.

14 Claims, 20 Drawing Sheets

(56) References Cited

U.S. PATENT DOCUMENTS

| | | | | |
|---|---|---|---|---|
| 8,134,278 | B2 * | 3/2012 | Cho | G01N 29/022<br>310/313 R |
| 8,564,172 | B2 * | 10/2013 | Seki | H03H 3/10<br>310/313 C |
| 10,587,243 | B2 * | 3/2020 | Park | H10N 30/877 |

* cited by examiner

SURFACE ACOUSTIC WAVE DEVICE INCLUDING IDT ELECTRODES HAVING METAL OXIDE LAYER FORMED THEREON AND METHOD FOR FABRICATING THE SAME

BACKGROUND

1. Technical Field

The present disclosure relates to a surface acoustic wave device including interdigital (IDT) electrodes having an oxide electrode layer formed thereon, and more specifically, to a surface acoustic wave device whose frequency characteristics may be controlled by controlling the thickness of an oxide electrode layer formed on IDT electrodes by performing an oxidation process, and a method for fabricating the same.

2. Related Art

The term "surface acoustic wave (SAW)" refers to waves that propagate along the surface of an elastic solid. These surface acoustic waves propagate as the wave energy is concentrated near the surface, and correspond to mechanical waves. Surface acoustic wave devices are electromechanical devices based on the interaction between surface acoustic waves and semiconductor conduction electrons, and use surface acoustic waves transferred to the surface of a piezoelectric crystal. These surface acoustic wave devices may be used in a very wide range of industrial applications, such as sensors, oscillators, and filters, and may be miniaturized and lightweight. Also, these devices may have various advantages such as robustness, stability, sensitivity, low price, and real-time performance.

The surface acoustic wave device includes a plurality of IDT electrodes extending alternately from bus bars extending in parallel, and each of the plurality of IDT electrodes includes at least one material selected from conductive metal materials and alloys thereof. The resonant frequency of the surface acoustic wave device is determined by the thickness of the piezoelectric layer, the thickness of the energy confining layer under the piezoelectric layer, and especially the thickness of the IDT electrode and the width of the electrode.

With the development of communication technology, the performance required for surface acoustic wave devices has become more sophisticated to support, for example, carrier aggregation (CA) in 5G. Accordingly, the allowable range of the resonant frequency has become increasingly narrow, and the difficulty in individually controlling each of the above-mentioned factors to improve the frequency distribution has continuously increased.

SUMMARY

An object of the present disclosure is to provide a surface acoustic wave device whose frequency distribution may be precisely controlled by including an oxide electrode layer formed by oxidation of an upper electrode layer on IDT electrodes, and a method for fabricating the same.

Another object of the present disclosure is to provide a surface acoustic wave device whose frequency distribution may be effectively controlled while maintaining the peak loss and bandwidth within performance tolerances by adjusting the thickness of an oxide electrode layer formed on IDT electrodes, and a method for fabricating the same.

Objects of the present disclosure are not limited to the above-mentioned objects, and other objects not mentioned above will be clearly understood by those skilled in the art from the following description.

To achieve the above objects, a surface acoustic wave device including IDT electrodes having an oxide electrode layer formed thereon according to some embodiments of the present disclosure includes a piezoelectric substrate and a plurality of IDT electrodes formed on the piezoelectric substrate, wherein each of the plurality of IDT electrodes includes: a main electrode layer formed on the upper surface of the piezoelectric substrate; an upper electrode layer formed on the main electrode layer; and an oxide electrode layer formed on the upper surface of the upper electrode layer by oxidation of the upper electrode layer, and wherein the thickness ($t_e$) of each of the plurality of IDT electrodes satisfies $0.011 \le t_o/t_e \le 0.333$ with respect to the thickness ($t_o$) of the oxide electrode layer.

In some embodiments of the present disclosure, the oxide electrode layer may include: a first oxide electrode layer having a first density and forming an upper portion of the oxide electrode layer; and a second oxide electrode layer having a second density lower than the first density and located beneath the first oxide electrode layer.

In some embodiments of the present disclosure, the first oxide electrode layer may be a native oxide layer, and the second oxide electrode layer may be formed through an oxidation process by irradiating the upper electrode layer with an ion beam.

In some embodiments of the present disclosure, the upper electrode layer may include titanium (Ti), and the oxide electrode layer may include titanium oxide.

In some embodiments of the present disclosure, the upper electrode layer may include aluminum (Al), and the oxide electrode layer may include aluminum oxide.

In some embodiments of the present disclosure, the main electrode layer may include at least one metal material selected from among aluminum (Al), copper (Cu), titanium (Ti), tungsten (W), molybdenum (Mo), platinum (Pt), and gold (Au).

To achieve the above objects, a surface acoustic wave device including IDT electrodes having an oxide electrode layer formed thereon according to some embodiments of the present disclosure includes a piezoelectric substrate having a first region and a second region defined thereon, a plurality of first IDT electrodes formed in the first region, and a plurality of second IDT electrodes formed in the second region, wherein each of the plurality of first IDT electrodes has a first thickness and includes: a first main electrode layer formed on the upper surface of the piezoelectric substrate in the first region; a first upper electrode layer formed on the first main electrode layer; and a first oxide electrode layer formed on the upper surface of the first upper electrode layer by oxidation of the first upper electrode layer, and each of the plurality of second IDT electrodes has a second thickness and includes: a second main electrode layer formed on the upper surface of the piezoelectric substrate in the second region; a second upper electrode layer formed on the second main electrode layer; and a second oxide electrode layer formed on the upper surface of the second upper electrode layer by oxidation of the second upper electrode layer, wherein the first thickness and the second thickness are different from each other.

In some embodiments of the present disclosure, the plurality of first IDT electrodes may correspond to a first center frequency, the plurality of second IDT electrodes may correspond to a second center frequency lower than the first center frequency, and the first thickness may be smaller than the second thickness.

In some embodiments of the present disclosure, the thickness of the first oxide electrode layer may be smaller than the thickness of the second oxide electrode layer.

In some embodiments of the present disclosure, the first thickness ($t_{e1}$) may satisfy $0.011 \leq t_{o1}/t_{e1} \leq 0.333$ with respect to the thickness ($t_{o1}$) of the first oxide electrode layer, and the second thickness ($t_{e2}$) may satisfy $0.011 \leq t_{o2}/t_{e2} \leq 0.333$ with respect to the thickness ($t_{o2}$) of the second oxide electrode layer.

In some embodiments of the present disclosure, the density of the first oxide electrode layer may be greater than the density of the second oxide electrode layer.

To achieve the above objects, a method for fabricating a surface acoustic wave filter formed on a substrate with a multilayer structure according to some embodiments of the present disclosure includes steps of: preparing a piezoelectric substrate; forming an IDT electrode film including a main electrode layer and an upper electrode layer on the piezoelectric substrate; forming an oxide electrode layer by oxidizing the upper surface of the upper electrode layer; and forming IDT electrodes by pattering the IDT electrode film.

In some embodiments of the present disclosure, the step of forming the oxide electrode layer by oxidizing the upper surface of the upper electrode layer may include a step of forming the oxide electrode layer by irradiating the upper electrode layer with an ion beam.

In some embodiments of the present disclosure, the piezoelectric substrate may have a first region and a second region defined thereon, and the step of forming the IDT electrode film may include a step of forming a first IDT electrode film in the first region to have a first thickness, and forming a second IDT electrode film in the second region to have a second thickness, wherein the first thickness and the second thickness may be different from each other.

In some embodiments of the present disclosure, the step of forming the oxide electrode layer by oxidizing the upper surface of the upper electrode layer may include forming a first oxide electrode layer by irradiating the upper surface of the first upper electrode layer included in the first IDT electrode film with an ion beam at a first scan rate, and forming a second oxide electrode layer by irradiating the upper surface of the second upper electrode layer included in the second IDT electrode film with an ion beam at a second scan rate different from the first scan rate.

In some embodiments of the present disclosure, the thickness of the first IDT electrode and the thickness of the first oxide electrode layer may be smaller than the thickness of the second IDT electrode and the thickness of the second oxide electrode layer, respectively, the first IDT electrode may correspond to a first center frequency, and the second IDT electrode may correspond to a second center frequency lower than the first center frequency.

In some embodiments of the present disclosure, the density of the first oxide electrode layer may be greater than the density of the second oxide electrode layer.

Specific details of other embodiments are included in the following detailed description and the accompanying drawings.

According to the surface acoustic wave filter formed on a substrate with a multilayer structure and the method for fabricating the same according to an embodiment of the present disclosure, it is possible to effectively control the distribution of the resonant frequency, which may vary depending on the thickness and width of the IDT electrodes, the thickness of the piezoelectric layer, and the thickness of the energy confining layer under the piezoelectric layer, by adjusting the thickness of the oxide electrode layer.

Effects of the present disclosure are not limited to the effects mentioned above, and other effects not mentioned above will be clearly understood by those skilled in the art from the appended claims.

DETAILED DESCRIPTION

Figure 1:
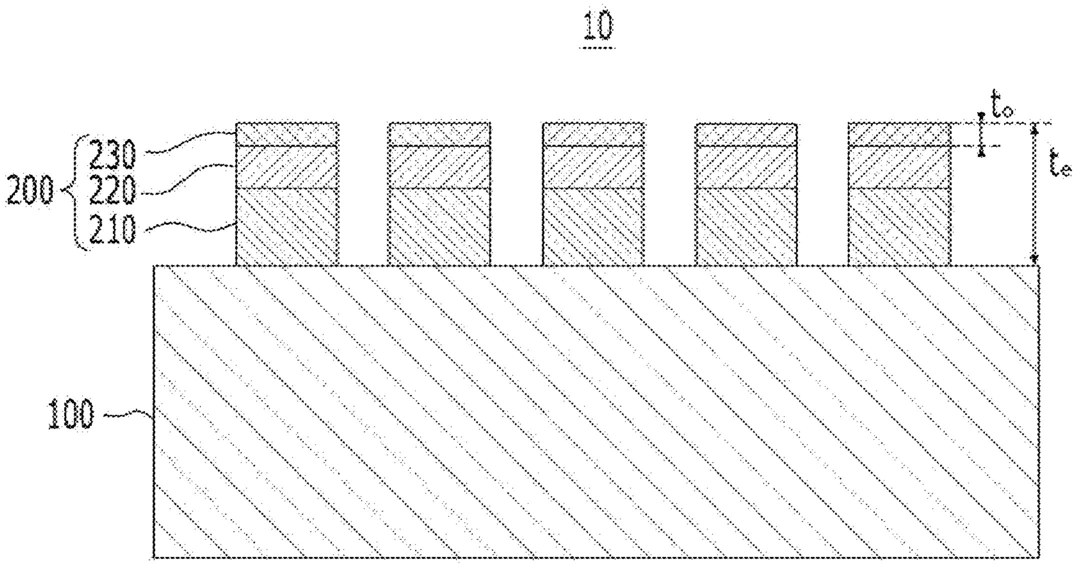
FIG. 1 illustrates a surface acoustic wave device including IDT electrodes having an oxide electrode layer thereon according to an embodiment of the present disclosure.

The advantages and features of the present disclosure, and the way of attaining them, will become apparent with reference to the embodiments described below in conjunction with the accompanying drawings. However, the present disclosure is not limited to the embodiments disclosed below and may be embodied in a variety of different forms. Rather, these embodiments are provided so that this disclosure will be thorough and complete, and will fully convey the scope of the present disclosure to those skilled in the art. The scope of the present disclosure will be defined by the appended claims. Like reference numerals refer to like components throughout the specification.

It is to be understood that, when a component is referred to as being "connected" or "coupled" to another component, it can be connected or coupled directly to the other component or intervening components may be present. In contrast, it should be understood that, when a component is referred to as being "directly connected" or "directly coupled" to another component, no intervening components are present. The term "and/or" includes any and all combinations of one or more of the associated listed items.

The terminology used herein is for describing embodiments and is not intended to limit the present disclosure. Singular expressions include plural expressions unless specified otherwise in the context thereof. As used herein, the terms "comprises", "includes", "comprising", and "including" are intended to denote the existence of mentioned components, steps, operations, and/or devices, but do not exclude the probability of existence or addition of one or more other components, steps, operations, and/or devices.

Although terms such as first, second, and the like are used to describe various components, these components should not be limited by these terms. These terms are merely used to distinguish one component from another component. Therefore, the first component mentioned below may also be the second component within the technical spirit of the present disclosure.

Unless otherwise defined, all terms (including technical and scientific terms) used herein have the same meaning as commonly understood by one of ordinary skill in the art to which the present disclosure pertains. It will be further understood that terms, such as those defined in commonly used dictionaries, will not be interpreted in an idealized or overly formal sense unless expressly so defined herein.

FIG. 1 illustrates a surface acoustic wave device including IDT electrodes having an oxide electrode layer thereon according to an embodiment of the present disclosure.

Referring to FIG. 1, a surface acoustic wave device 10 according to an embodiment of the present disclosure may include a plurality of IDT electrodes 200 formed on a piezoelectric substrate 100. Meanwhile, although not shown in FIG. 1, a dielectric layer may be further formed to cover the piezoelectric substrate 100 and the plurality of IDT electrodes 200.

The piezoelectric substrate 100 may be a multilayer substrate that may include a plurality of layers. The plurality of layers may include, for example, a support substrate including silicon, a high acoustic velocity layer including a material such as amorphous silicon (a-Si) or polysilicon, a low acoustic velocity layer including a material such as silicon dioxide ($SiO_2$) or aluminum nitride (AlN), and a piezoelectric layer including a material such as $LiTaO_3$ (LT) or $LiNbO_3$ (LN) and located on the low acoustic velocity layer to constitute the uppermost layer, but the present disclosure is not limited thereto. In some embodiments, the piezoelectric substrate 100 may be configured by omitting at least one of the high acoustic velocity layer and the low acoustic velocity layer. In the drawings, including FIG. 1, the plurality of layers are omitted and shown as the piezoelectric substrate 100.

A plurality of IDT electrodes 200 may be formed on the piezoelectric substrate 100. The plurality of IDT electrodes 200 may correspond to a plurality of electrodes extending alternately from two bus bars facing each other on the surface of the piezoelectric substrate 100.

Each of the IDT electrodes 200 may include a conductive material and, in particular, may be divided into two or more metal layers. As shown in FIG. 1, the IDT electrode 200 may include three portions: a main electrode layer 210, an upper electrode layer 220, and an oxide electrode layer 230.

The main electrode layer 210 may be formed to contact the piezoelectric substrate 100, and may include at least one metal material selected from among, for example, aluminum (Al), copper (Cu), titanium (Ti), tungsten (W), molybdenum (Mo), platinum (Pt), gold (Au), etc.

The upper electrode layer 220 may be formed to cover the upper surface of the main electrode layer 210, and may include, for example, a layer of titanium (Ti) or an alloy of titanium (Ti) and one or more metal materials. Alternatively, the upper electrode layer 220 may include a layer of aluminum (Al) or an alloy of aluminum (Al) and one or more metal materials.

The upper electrode layer 220 may prevent oxidation of the main electrode layer 210 and reduce contact loss with a wiring layer that may be formed on the IDT electrode 200. That is, when the upper surface of the main electrode layer 210 is exposed, an oxide (e.g., aluminum oxide ($Al_2O_3$)) of the main electrode layer 210 is naturally formed, which may form a capacitive junction upon contact with the wiring layer, which causes an increase in contact loss and deterioration in performance. Thus, the upper electrode layer 220 may be formed on the main electrode layer 210 to minimize contact resistance upon contact with the lower portion of the wiring layer and prevent performance from being deteriorated due to contact loss.

An oxide electrode layer 230 may be formed on the upper surface of the upper electrode layer 220. The oxide electrode layer 230 may be formed by oxidizing the upper electrode layer 220. Accordingly, the material forming the oxide electrode layer 230 may be an oxide of the material constituting the upper electrode layer 220. As the oxide electrode layer 230 is formed, the density of the IDT electrode 200, especially the upper electrode layer 220 and the oxide electrode layer 230, decreases, the surface acoustic wave velocity decreases, and the resonant frequency of the surface acoustic wave device 10 shifts to a low frequency. Using this principle, the frequency distribution of the surface acoustic wave device 10 according to an embodiment of the present disclosure seeks is improved.

As described above, the resonant frequency of the surface acoustic wave device 10 may be determined by the thickness ($t_o$) of the IDT electrode 200. As the IDT electrode 200 is for a higher bandwidth, it has a smaller thickness ($t_o$), and in this case, the amount of frequency shift due to the change in the thickness ($t_o$) of the IDT electrode 200 increases toward the higher bandwidth. In extreme cases, even when the thickness of the IDT electrode 200 changes at the level of several nanometers (nm) during the film formation process, there are cases where the frequency distribution is several MHz or more.

It is possible to improve the yield of the surface acoustic wave device 10, which satisfies the frequency margin, by forming the IDT electrode 200 in which the main electrode layer 210 and the upper electrode layer 220 are sequentially stacked to have a required bandwidth or more, and then leveling the frequency downward through oxidation of the upper electrode layer 220.

In particular, in the case in which the piezoelectric substrate 100 has a structure consisting of a support substrate, a high acoustic velocity layer, a low acoustic velocity layer, and a piezoelectric layer, the structure of the IDT electrode 200 according to an embodiment of the present disclosure has a greater effect. Since the piezoelectric substrate 100 including the energy confining layer consisting of the high acoustic velocity layer and/or the low acoustic velocity layer has a very thin piezoelectric layer, controlling the frequency distribution is more difficult due to the influence of the thickness distribution of the piezoelectric layer and the thickness distribution of the energy confining layer. Therefore, process control that satisfies the frequency margin is possible by the structure in which the upper electrode layer 220 and the anode layer 230 are formed, like the IDT electrode 200 included in the surface acoustic wave device 10 of the present disclosure.

Figure 2A:
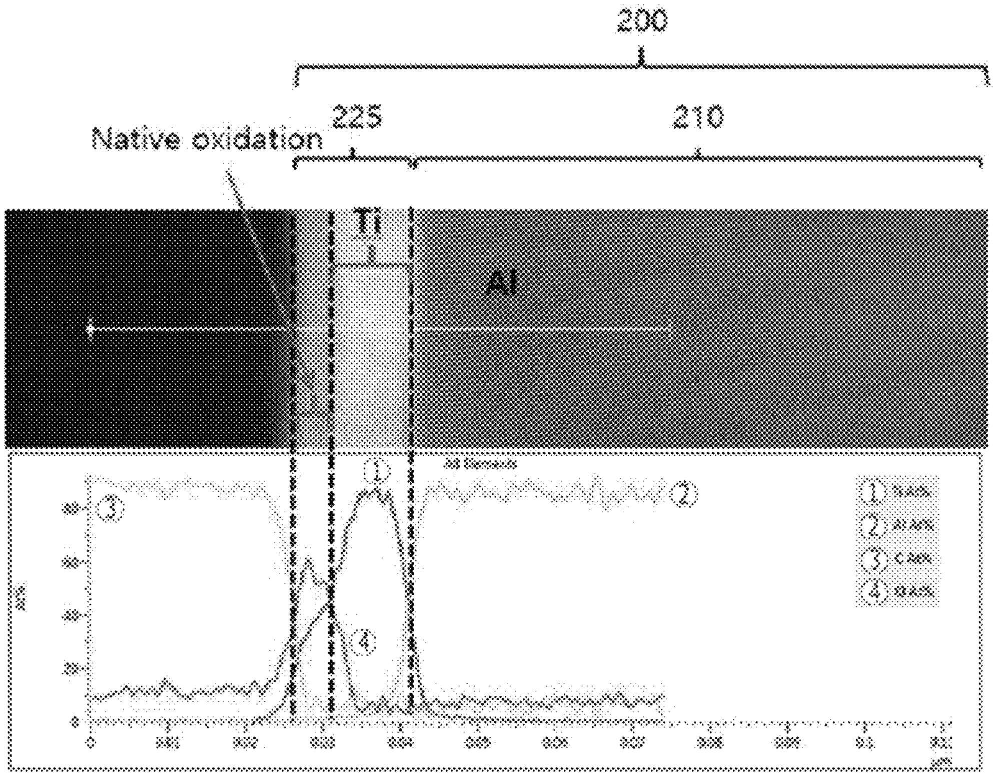
FIG. 2*a* shows a transmission electron microscope (TEM) photograph and an energy dispersive spectrometer (EDS) graph before performing an oxidation process on the upper metal layer of each IDT electrode of the surface acoustic wave device.
Figure 2B:
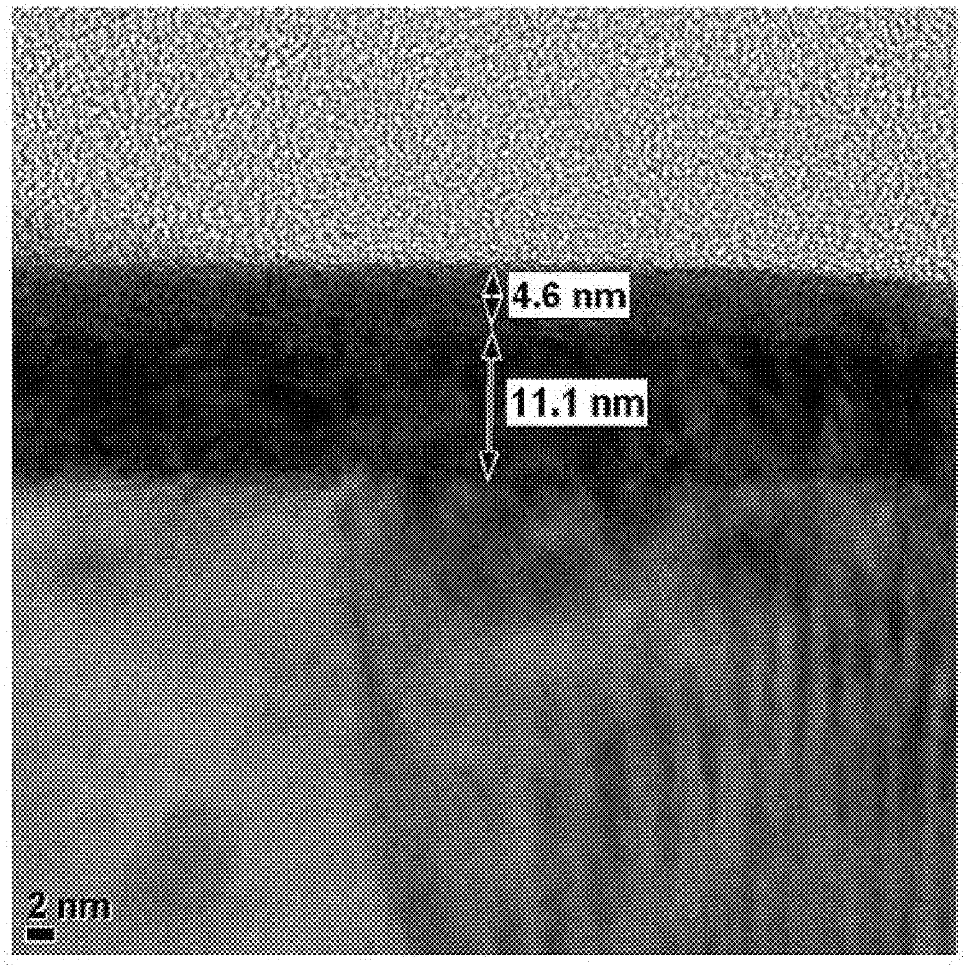
FIG. 2*b* shows a TEM photograph of the IDT electrode with thickness values.

FIG. 2*a* shows a transmission electron microscope (TEM) photograph and an energy dispersive spectrometer (EDS) graph before performing an oxidation process on the upper metal layer of each IDT electrode of the surface acoustic wave device, and FIG. 2*b* shows a TEM photograph of the IDT electrode with thickness values.

Referring to FIG. 2*a*, the main electrode layer 210 and the upper electrode layer 225 are sequentially stacked to form the IDT electrode 200. The main electrode layer 210 includes aluminum (Al) and the upper electrode layer 225 includes titanium (Ti). The boundary of each layer may be distinguished as shown in the TEM photograph. As shown in the EDS graph, the upper electrode layer 225 contains a certain atomic percentage (at %) of oxygen, meaning that it is a native oxide layer formed by oxidation of the upper portion of an upper metal layer due to atmospheric oxygen. As shown in the EDS graph and FIG. 2*b*, the thickness of the upper metal layer 221 may be about 15.7 nm, and the native oxide layer may be formed to have a thickness of about 4.6 nm.

Figure 3A:
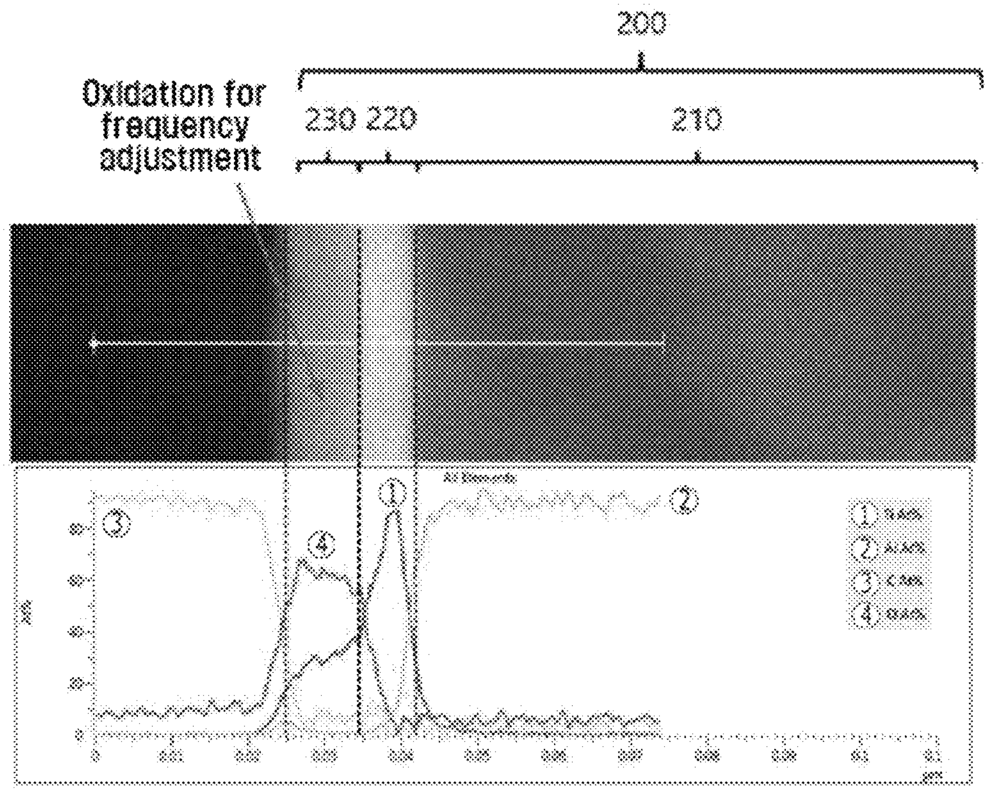
FIG. 3*a* shows a TEM photograph and an EDS graph after performing an oxidation process on the upper metal layer of each IDT electrode of the surface acoustic wave device according to an embodiment of the present disclosure.
Figure 3B:
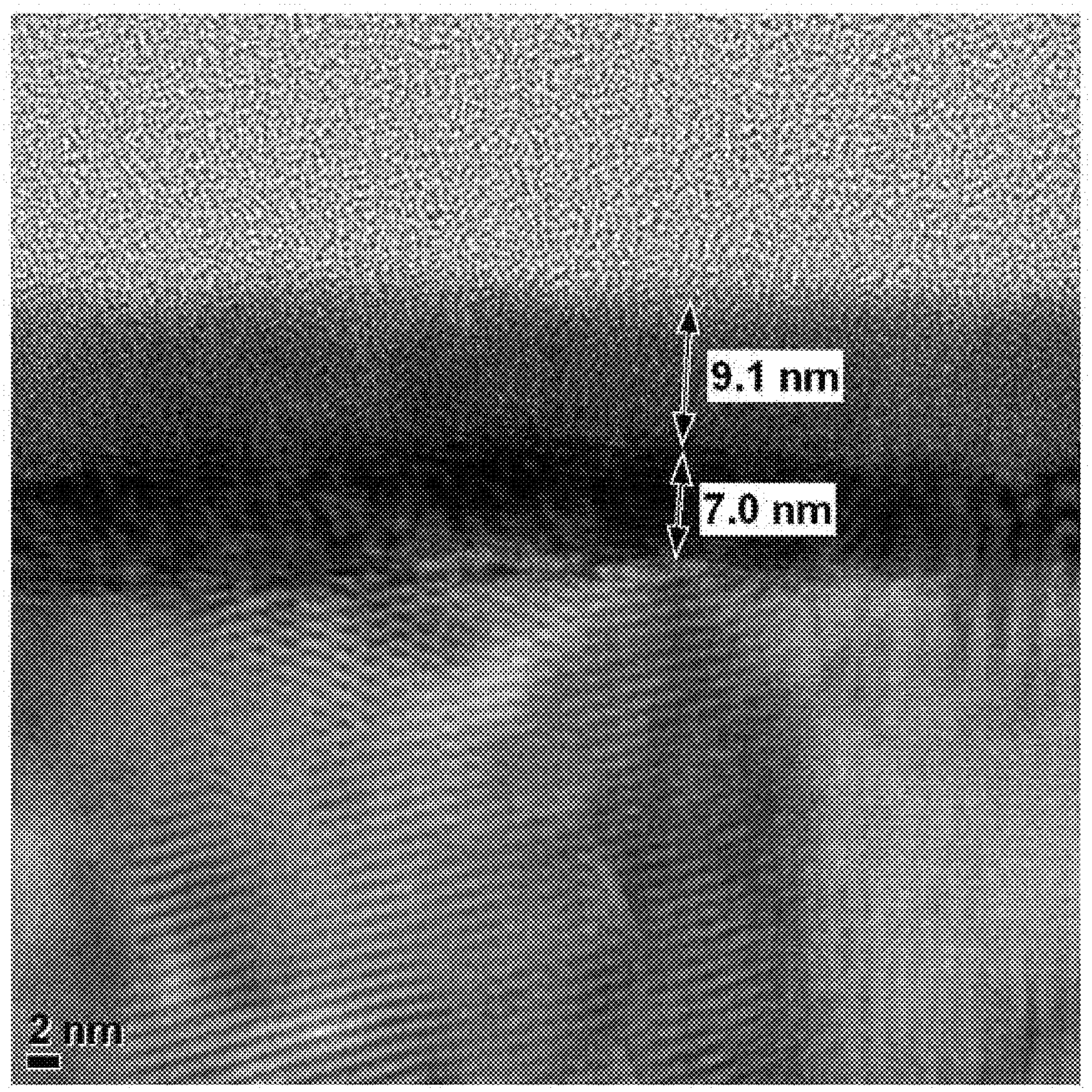
FIG. 3*b* shows a TEM photograph of the IDT electrode together with thickness values after performing the oxidation process.

FIG. 3*a* shows a TEM photograph and an EDS graph after performing an oxidation process on the upper metal layer of each IDT electrode of the surface acoustic wave device according to an embodiment of the present disclosure, and FIG. 3*b* shows a TEM photograph of the IDT electrode together with thickness values after performing the oxidation process.

Referring to FIG. 3*a*, it is shown that, as the oxide electrode layer 230 is formed by performing oxidation of the upper metal layer 221 shown in FIG. 2*a*, the oxide electrode layer 230 with a thickness of about 9.1 nm is formed on the upper electrode layer 220. It can be seen that due to oxidation, the oxide electrode layer 230 has an additional thickness of about 4.5 nm in addition to the about 4.6-nm-thick native oxide layer shown in FIGS. 2*a* and 2*b*, and the upper electrode layer 220 remains about 7.0 nm thick.

The thickness of the oxide electrode layer 230 ($t_o$ in FIG. 1) increases as the oxidation time for the upper metal layer 221 increases. The oxidation process on the upper metal layer 221 may be performed in various ways, but in the case of an oxidation process using an ion beam, it can be seen that the dwell time of the ion beam on each IDT electrode 200 and the power of the ion beam determine the amount of oxidation of the upper metal layer 221, that is, the thickness ($t_o$) of the oxide electrode layer 230.

In the present disclosure, it is proposed to control the dwell time of the ion beam by fixing the power of the ion beam and changing the scan rate, and to adjust the thickness ($t_o$) of the oxide electrode layer 230. FIGS. 3*a* and 3*b* show a case where the dwell time per IDT electrode is controlled to 0.003 seconds. When the dwell time is increased, the thickness ($t_o$) of the oxide electrode layer 230 may be increased.

Figure 4A:
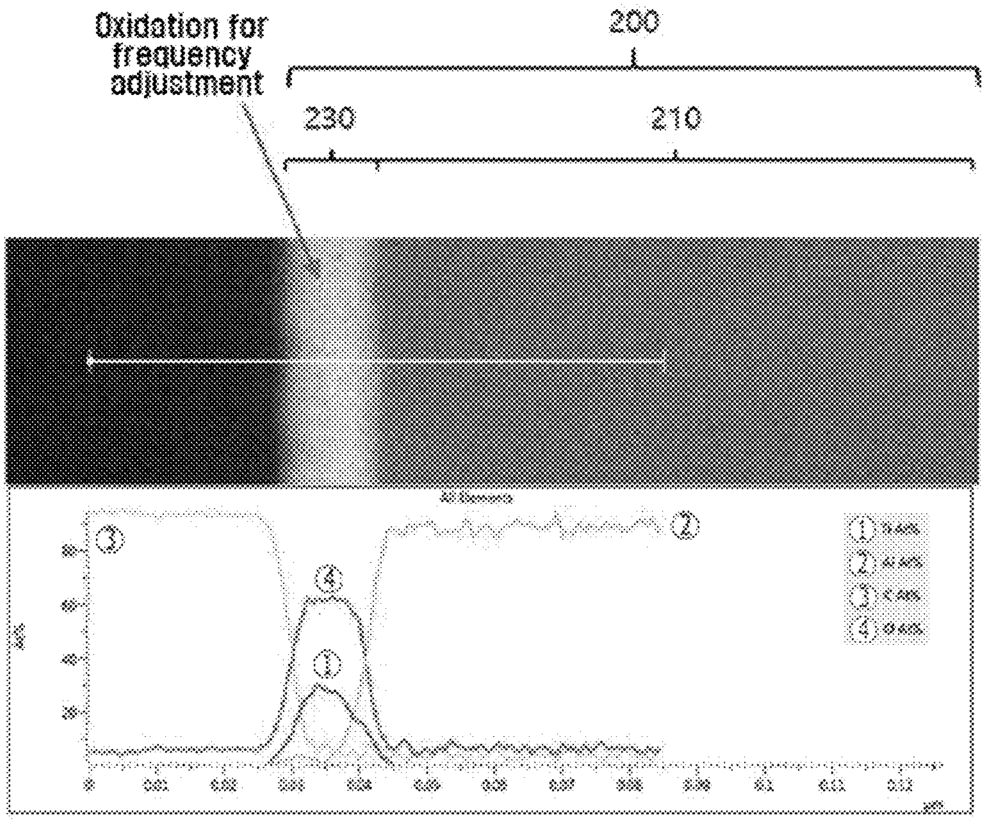
FIG. 4*a* shows a TEM photograph and an EDS graph after performing an oxidation process on the upper metal layer of each IDT electrode of the surface acoustic wave device according to an embodiment of the present disclosure.
Figure 4B:
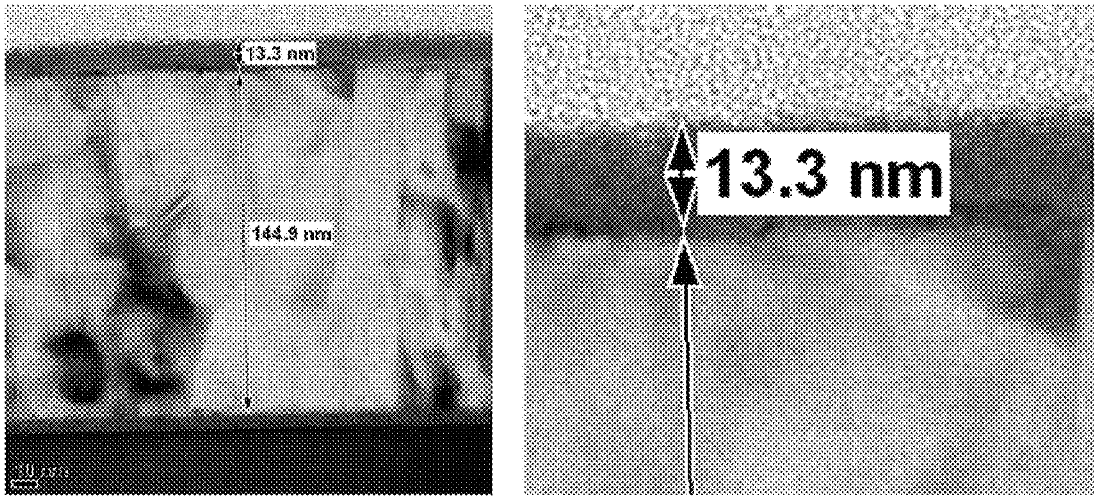
FIG. 4*b* shows TEM photographs of the IDT electrode together with thickness values after performing the oxidation process.

FIG. 4*a* shows a TEM photograph and an EDS graph after performing an oxidation process on the upper metal layer of the IDT electrodes of the surface acoustic wave device according to an embodiment of the present disclosure, and FIG. 4*b* shows TEM photographs of the IDT electrode together with thickness values after performing the oxidation process.

Referring to FIGS. 4*a* and 4*b*, this embodiment corresponds to a case where the dwell time is controlled to 0.02 seconds so that the upper electrode layer 220 is completely oxidized and only the oxide electrode layer 230 is formed on the main electrode layer 210, wherein thickness ($t_o$) of the oxide electrode layer 230 is 13.3 nm.

As such, the thickness ($t_e$) of the oxide electrode layer 230 of the IDT electrode 200 may be adjusted by controlling the dwell time, and the resonant frequency of the surface acoustic wave device 10 shifts to a low frequency. The relationship between the change in frequency and each of the scan rate and dwell time will be explained with reference to FIGS. 5*a* and 5*b*.

Figure 5A:
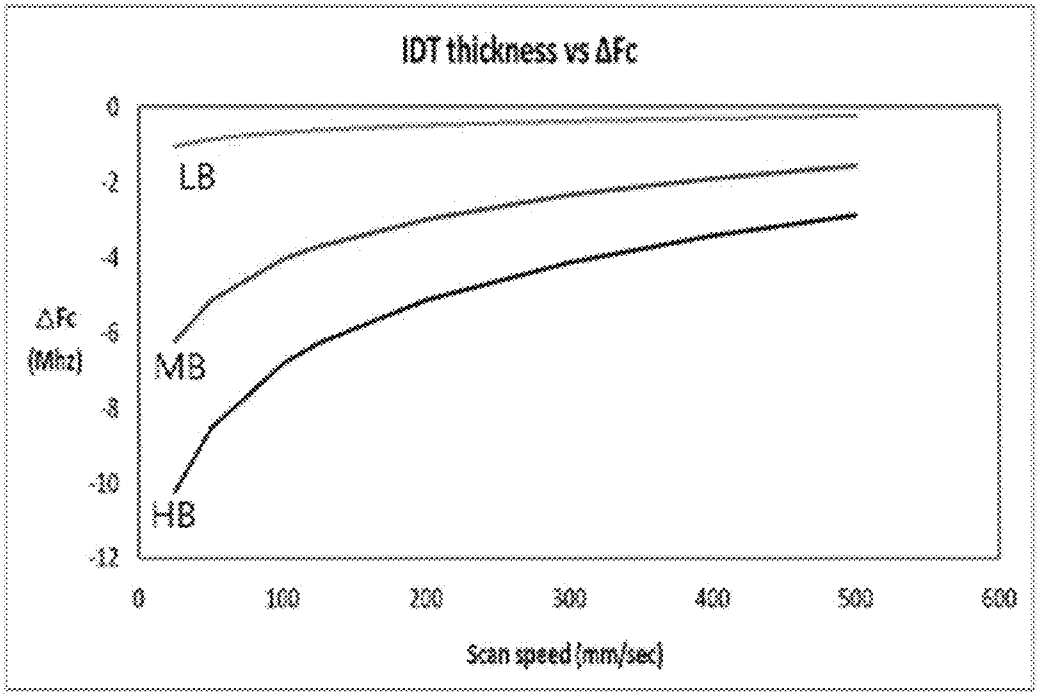
FIGS. 5*a* and 5*b* are graphs showing the relationship between the change in frequency and each of the scan rate and dwell time for performing an oxidation process on the upper metal layer of each IDT electrode of the surface acoustic wave device according to an embodiment of the present disclosure.
Figure 5B:
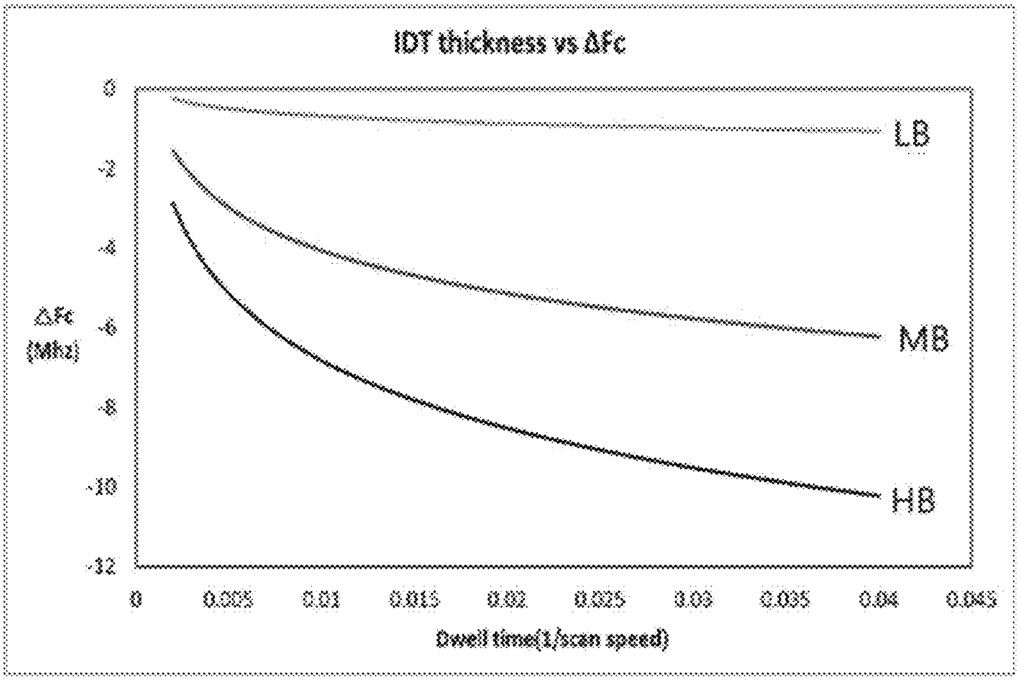

FIGS. 5*a* and 5*b* are graphs showing the relationship between the change in frequency and each of the scan rate and dwell time for performing an oxidation process on the upper metal layer of each IDT electrode of the surface acoustic wave device according to an embodiment of the present disclosure.

Referring to FIGS. 5*a* and 5*b*, FIG. 5*a* shows the change in frequency (ΔFc) with the change in scan rate, and FIG. 5*b* shows the change in frequency (ΔFc) with the change in dwell time. As the scan rate of the ion beam increases, the dwell time of the ion beam to stay on each IDT electrode 200 decreases. Thus, the graphs of the changes in frequency depending on the scan rate and dwell time have an inverse relationship. Meanwhile, as the dwell time increases, that is, as the thickness of the oxide electrode layer 230 increases, the change in frequency increases, but a linear relationship between the two is not observed.

In addition, as shown in FIGS. 5*a* and 5*b*, the change in frequency (ΔFc) due to the creation of the oxide electrode layer 230 increases from the low band (LB) to the mid band (MB) and high band (HB). That is, since the thickness of the IDT electrode for the high band is the smallest, when the oxide electrode layer 230 is formed using the same dwell time, the proportion of the thickness of the oxide electrode layer 230 in the total thickness of the IDT electrode 200 increases, and thus the impact thereof becomes more significant. In this case, the thickness of the oxide electrode layer 230 may be adjusted by varying the scan speed or dwell time for each band, that is, for the IDT electrodes 200 with different thicknesses.

Figure 6A:
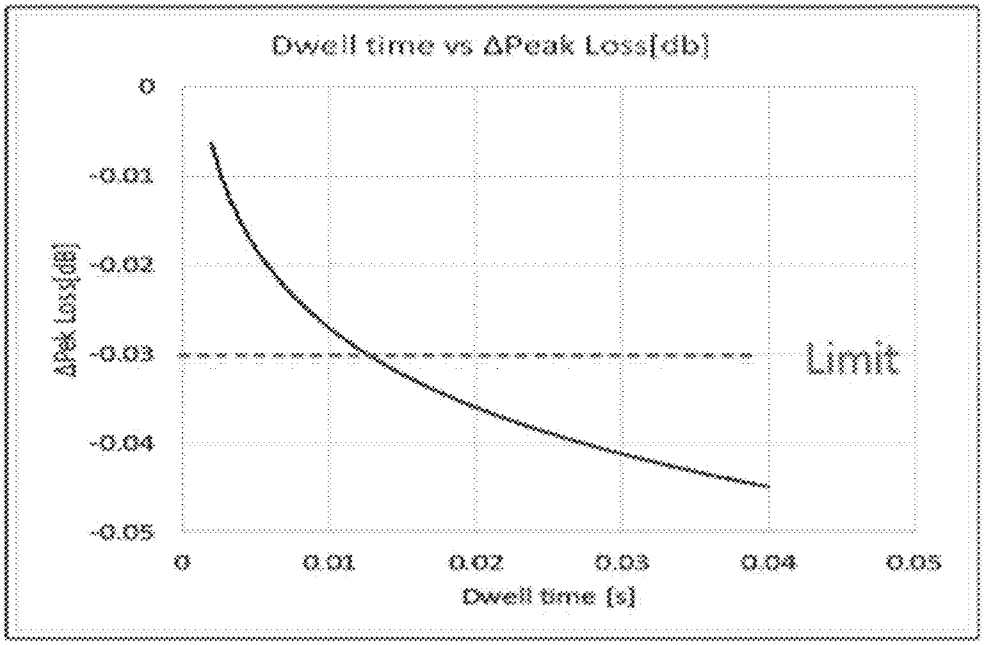
FIGS. 6*a* to 6*c* respectively show peak loss, bandwidth, and frequency change as a function of the dwell time for performing an oxidation process on the upper metal layer of each IDT electrode of the surface acoustic wave device according to an embodiment of the present disclosure.
Figure 6B:
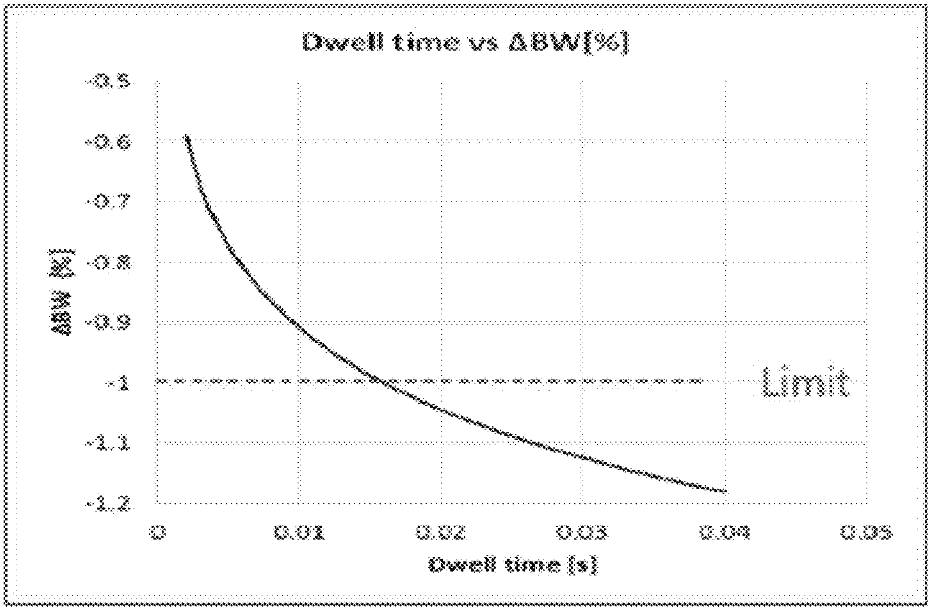
Figure 6C:
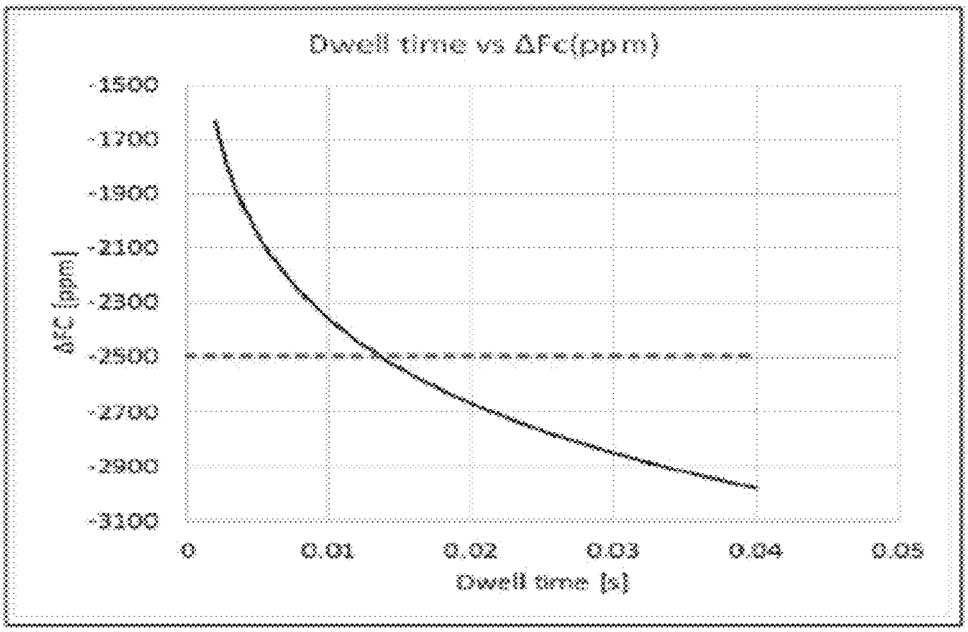

FIGS. 6*a* to 6*c* respectively show peak loss, bandwidth, and frequency change as a function of the dwell time for performing an oxidation process on the upper metal layer of each IDT electrode of the surface acoustic wave device according to an embodiment of the present disclosure. It can be seen that as the dwell time increases, the changes in peak loss (ΔPek) and bandwidth (ΔBW) also increase.

Therefore, as the oxidation process is performed, not only a frequency shift occurs, but also a phenomenon occurs in which the bandwidth decreases due to a decrease in peak loss and a decrease in the electromechanical coupling factor (K2). For this reason, it is necessary to adjust the thickness ($t_o$) of the oxide electrode layer 230 within a range that satisfies the performance required for the surface acoustic wave device 10.

Therefore, the frequency is adjusted by forming the oxide electrode layer 230, but in order to satisfy the performance required for the surface acoustic wave device 10, the change in bandwidth is within 1%, the change in peak loss is within 0.03 dB, and the range of frequency change is determined at the −2,500 ppm level as shown in FIG. 6*c*.

Table 1 below shows the results of identifying the thickness range of the oxide electrode layer 230 that satisfies the ranges of the change in bandwidth, change in peak loss, and change in frequency with respect to the thickness ($t_e$) of the IDT electrode 230.

TABLE 1

| Band | IDT electrode thickness ($t_e$) | Oxide electrode layer thickness ($t_o$) | $t_o/t_e$ |
|---|---|---|---|
| HB | 120 | 1.5 | 0.013 |
| | | 40 | 0.333 |
| MB | 180 | 2 | 0.011 |
| | | 60 | 0.333 |
| LB | 500 | 5.5 | 0.011 |
| | | 100 | 0.200 |

Based on the above results, the range of the ratio of the thickness ($t_o$) of the oxide electrode layer 230 to the thickness ($t_e$) of the IDT electrode 200 is expressed by the following correlation equation:

$$0.011 \le t_o/t_e \le 0.333$$

In relation to the surface acoustic wave device 10 according to an embodiment of the present disclosure, the change in density due to the formation of the oxide electrode layer 230 will be described with reference to FIGS. 7*a* to 7*c*.

Figure 7A:
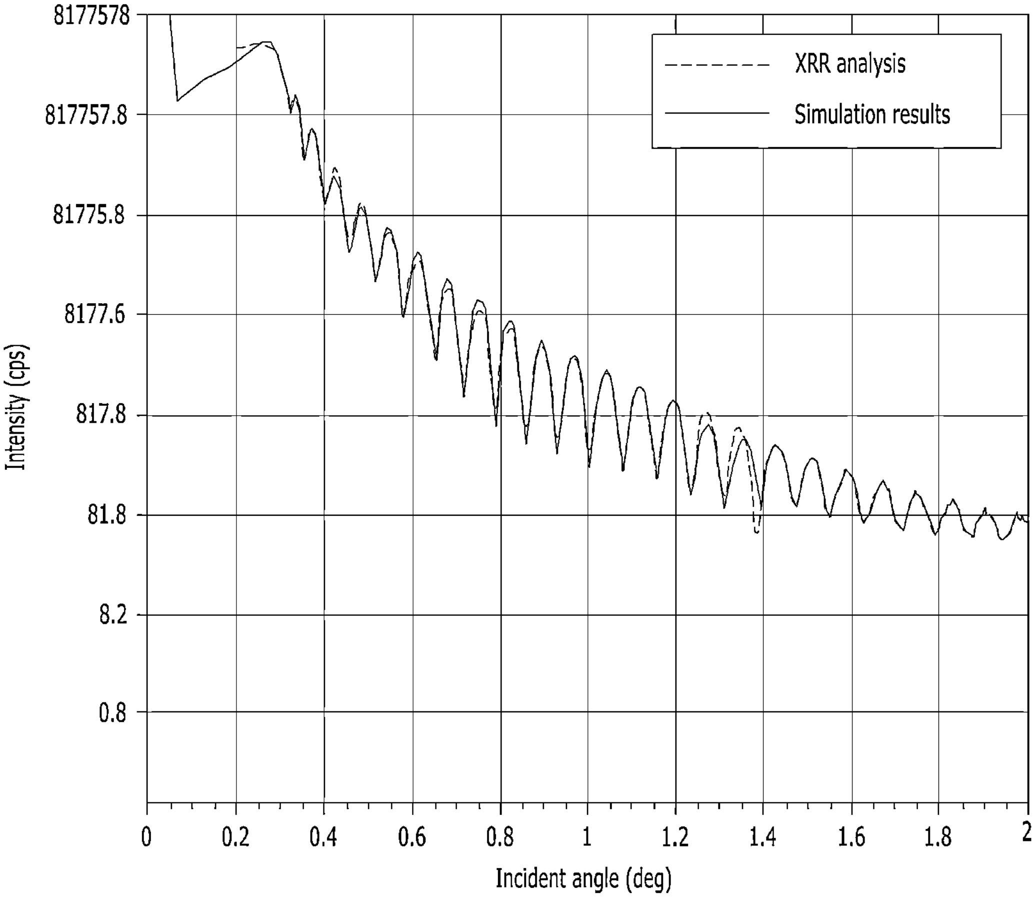
FIGS. 7*a* to 7*c* are graphs showing XRR analysis and simulation results for the upper electrode layer and the oxide electrode layer.

FIG. 7*a* is a graph showing the results of XRR analysis in a state in which a native oxide layer is formed without performing a separate oxidation process as shown in FIGS. 2*a* and 2*b*.

Referring to FIG. 7*a*, X-ray reflectometry (XRR) simulation results for the upper metal layer 221 before performing the oxidation process are shown. The upper metal layer 221 including titanium (Ti) was tested, and as described above, titanium oxide ($TiO_2$) formed by a native oxide layer was formed on the upper metal layer 221. In the upper metal layers 221, the thickness of the Ti thin layer was measured to be 53.6 nm, the density of the Ti thin layer was measured to be 4.41 g/cm$^3$, the thickness of the native oxide layer was measured to be 3.4 nm, and the density of the native oxide layer was measured to be 3.70 g/cm$^3$.

Figure 7B:
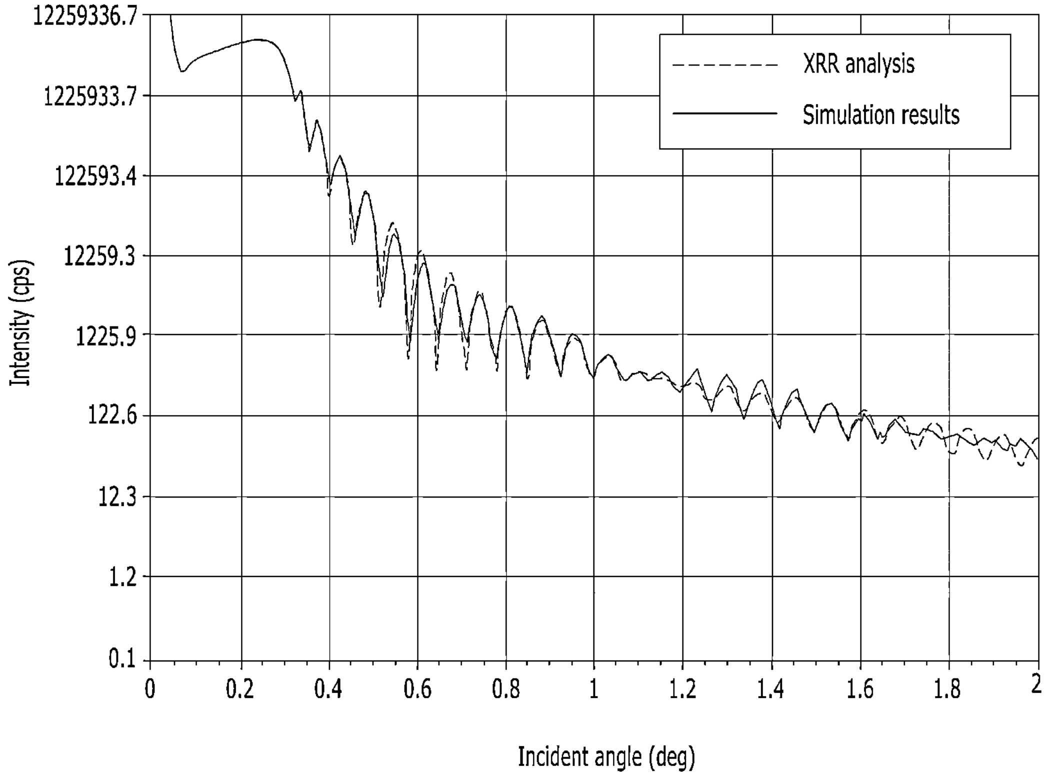

Meanwhile, referring to FIG. 7*b*, the results of performing XRR analysis and simulation at a scan rate of 400 mm/s and a dwell time of 0.0025 seconds are shown in a graph. The thickness of the Ti thin layer (corresponding to the upper electrode layer 220) was almost unchanged and measured to be 53.3 nm, and the density of the Ti thin layer was measured to be 4.41 g/cm$^3$. The thickness of the native oxide film was reduced to 2.4 nm, and the density thereof was measured to be 3.70 g/cm$^3$. An oxide electrode layer formed due to the oxidation process existed between the native oxide layer and the Ti thin layer, and the thickness and density thereof were measured to be 2.3 nm and 3.4 g/cm$^3$, respectively.

Figure 7C:
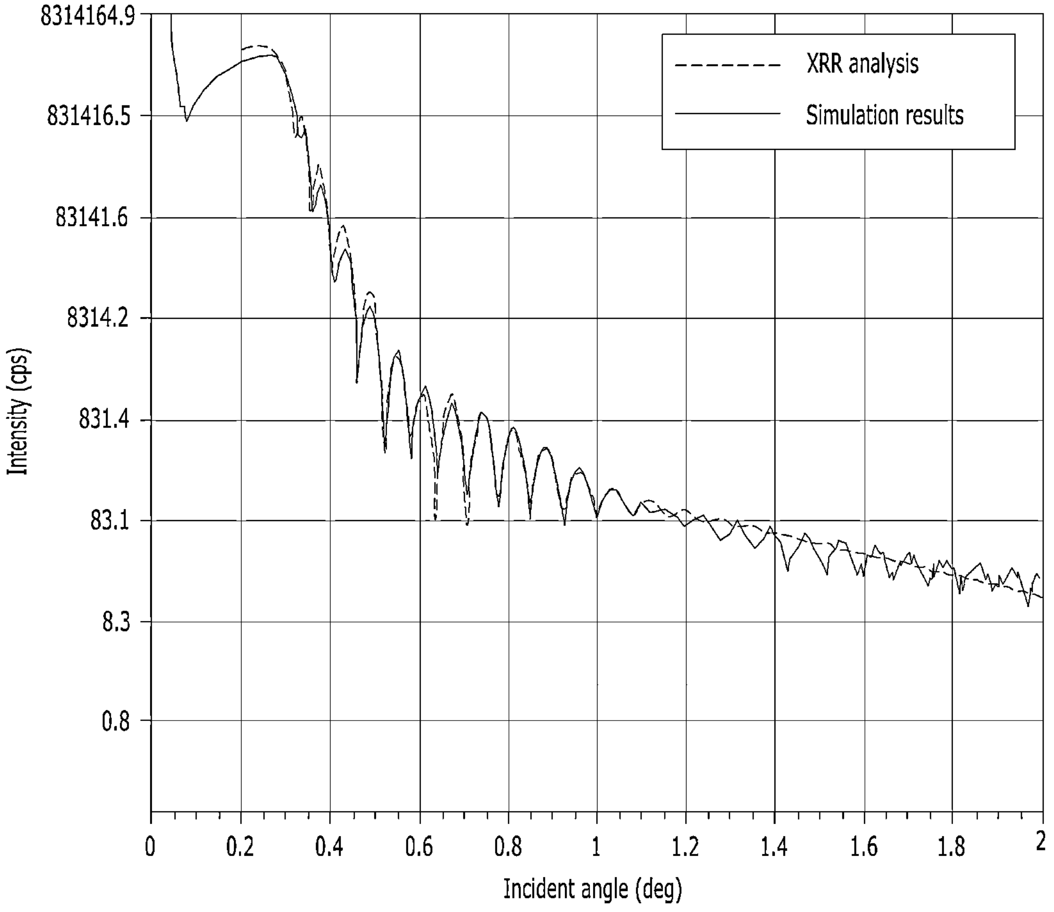

When the scan speed was reduced as shown in FIG. 7*c* (250 mm/s), the thickness of the Ti thin layer (corresponding to the upper electrode layer 220) decreased to 50.8 nm and the density thereof remained the same at 4.41 g/cm$^3$. The thickness of the native oxide layer was reduced to 2.5 nm, and the density thereof was measured to be 3.70 g/cm$^3$. An oxide electrode layer formed due to the oxidation process existed between the native oxide film layer the Ti thin layer, and the thickness and density thereof were measured to be 3.5 nm and 2.73 g/cm$^3$, respectively, which means that the thickness increased and the density decreased, compared to those in FIG. 7*b*.

Therefore, the IDT electrode 200 may include the upper electrode layer 220 formed on the main electrode layer 210, and the oxide electrode layer 230 including an oxide of the upper electrode layer 220, wherein the oxide electrode layer 230 may be divided into a first oxide electrode layer formed of a native oxide layer after forming the upper electrode layer 220, and a second oxide electrode layer formed on the upper electrode layer 220 through an oxidation process such as an ion beam irradiation process and having a lower density than that of the first oxide electrode layer.

Figure 8:
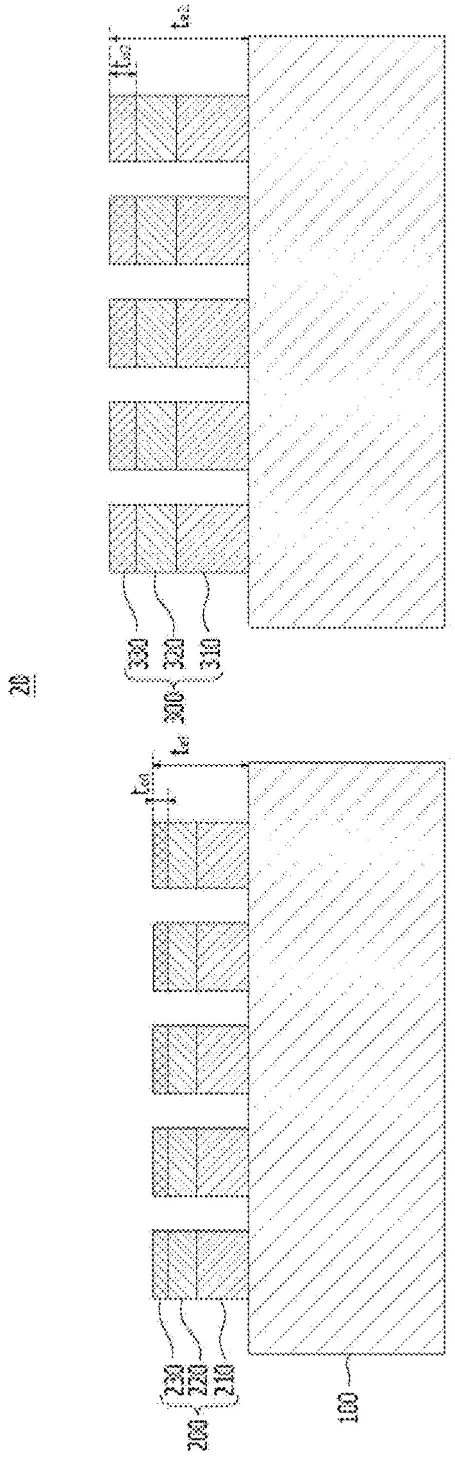
FIG. 8 illustrates a surface acoustic wave device according to another embodiment of the present disclosure.

FIG. 8 illustrates a surface acoustic wave device according to another embodiment of the present disclosure.

Referring to FIG. 8, a surface acoustic wave device 20 according to another embodiment of the present disclosure may include a plurality of first IDT electrodes 200 and a plurality of second IDT electrodes 300 formed on a piezoelectric substrate 100. The plurality of first IDT electrodes 200 and the plurality of second IDT electrodes 300 may be formed in different regions on the piezoelectric substrate 100. For example, the plurality of first IDT electrodes 200 may be disposed in the active region defined on the piezoelectric substrate 100, and the plurality of second IDT electrodes 300 may be disposed on the wiring region defined in the piezoelectric substrate 100, and thus a wiring may be additionally formed on the plurality of second IDT electrodes 300.

The first IDT electrode 200 may include three portions: a first main electrode layer 210, a first upper electrode layer 220, and a first oxide electrode layer 230. The second IDT electrode 300 may include a second main electrode layer 310, a second upper electrode layer 320, and a second oxide electrode layer 330. The layers constituting each of the first IDT electrode 200 and the second IDT electrode 300 may be configured similarly to those constituting the IDT electrode 200 described above with reference to FIG. 1.

However, the thickness ($t_{e1}$) of the first IDT electrode 200 and the thickness ($t_{e2}$) of the second IDT electrode 300 may be different from each other. Specifically, the thickness ($t_{e2}$) of the second IDT electrode 300 may be greater than the thickness ($t_{e1}$) of the first IDT electrode 200. As described above, the IDT electrode may be adjusted to control the center frequency of the surface acoustic wave device, and in particular, the IDT electrode needs to be formed thin in order to have a high-band center frequency.

Accordingly, in the surface acoustic wave device 20 according to an embodiment of the present disclosure, a filter with a first center frequency may be provided on the piezoelectric substrate 100 through the plurality of first IDT electrodes 200, and a filter with a second center frequency may be provided through the plurality of second IDT electrodes 300, wherein the first center frequency may be higher than the second center frequency.

In addition, as described above, the center frequency is adjusted while forming the first and second oxide electrode layers 230 and 330, and the thicknesses of the first and second oxide electrode layers 230 and 330 also need to vary depending on the thicknesses of the first and second IDT electrodes 200 and 300 in order to control the decreases in peak loss and bandwidth within certain ranges. Specifically, the thickness ($t_{o1}$) of the first oxide electrode layer 230 may be smaller than the thickness ($t_{o2}$) of the second oxide electrode layer 330. Therefore, in the oxidation process, the ion beam irradiation rate for the first IDT electrode 200 may be higher than the irradiation speed for the second IDT electrode 300.

As seen in FIGS. 7*a* to 7*c*, as the irradiation rate decreases and the thickness of the oxide electrode layer increases, the density of the oxide electrode layer decreases. Therefore, the density of the first oxide electrode layer 230 may be greater than the density of the second oxide electrode layer 330.

The ratio of the thickness ($t_{o1}$) of the first oxide electrode layer 230 to the thickness ($t_{e1}$) of the first IDT electrode 200 may satisfy the following correlation equation:

$$0.011 \le t_{o1}/t_{e1} \le 0.333$$

The ratio of the thickness ($t_{o2}$) of the second oxide electrode layer 330 to the thickness ($t_{e2}$) of the second IDT electrode 300 may satisfy the following correlation equation:

$$0.011 \le t_{o2}/t_{e2} \le 0.333$$

Figure 9:
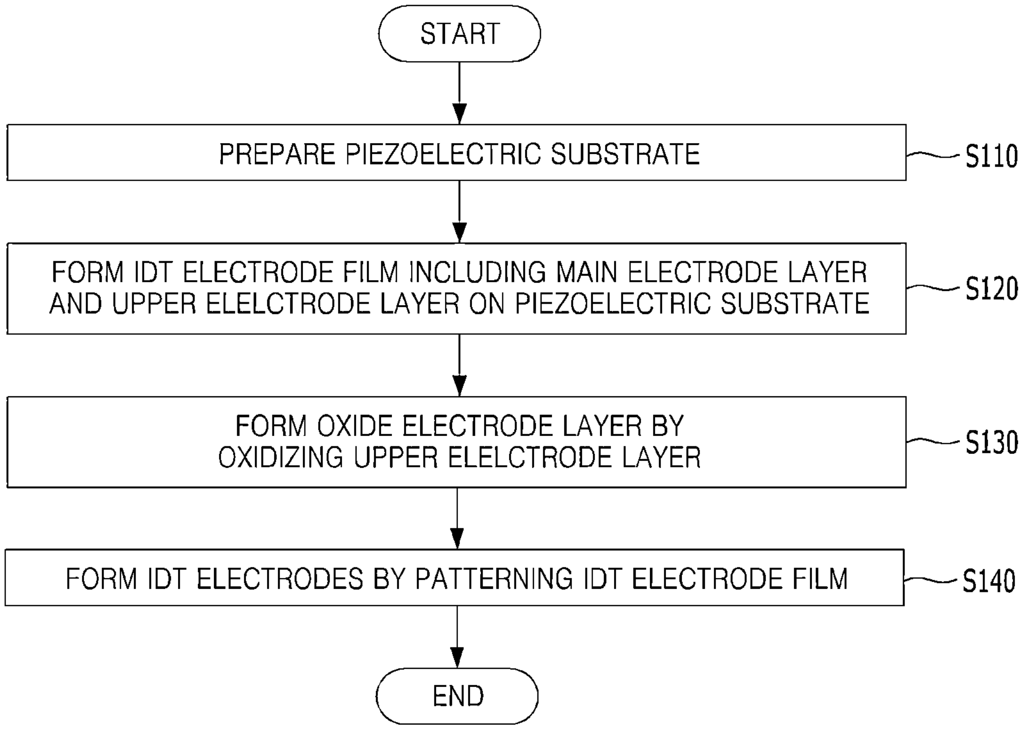
FIG. 9 is a flow diagram showing a method for fabricating a surface acoustic wave device according to an embodiment of the present disclosure.

FIG. 9 is a flow diagram showing a method for fabricating a surface acoustic wave device according to an embodiment of the present disclosure.

Referring to FIG. 9, the method for fabricating a surface acoustic wave device according to an embodiment of the present disclosure includes steps of: (S110) preparing a piezoelectric substrate; (S120) forming an IDT electrode film including a main electrode layer and an upper electrode layer on the piezoelectric substrate; (S130) forming an oxide electrode layer by oxidizing the upper surface of the upper electrode layer; and (S140) forming IDT electrodes by pattering the IDT electrode film.

Figure 10:
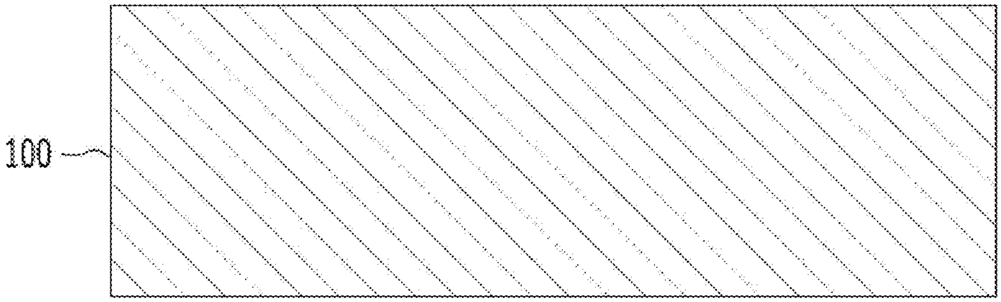
FIGS. 10 to 12 show intermediate steps of the method for fabricating a surface acoustic wave device according to an embodiment of the present disclosure.
Figure 11:
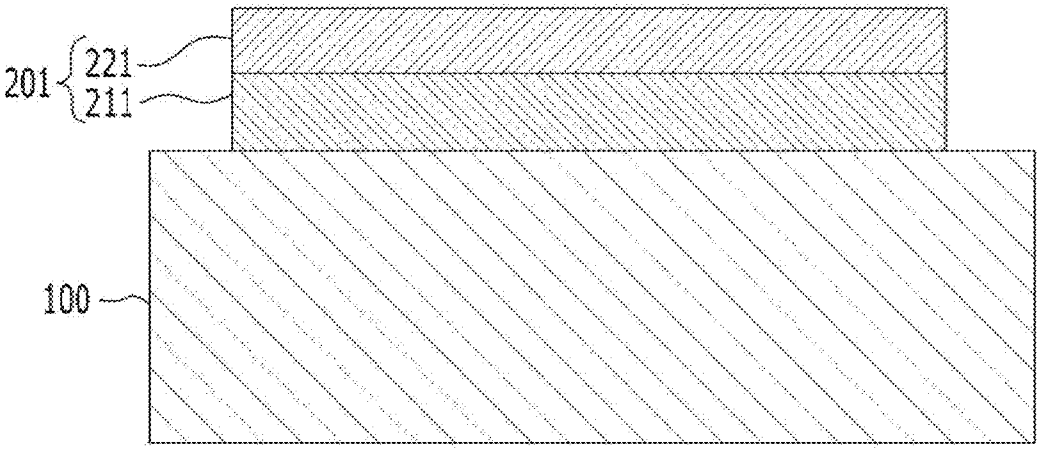
Figure 12:
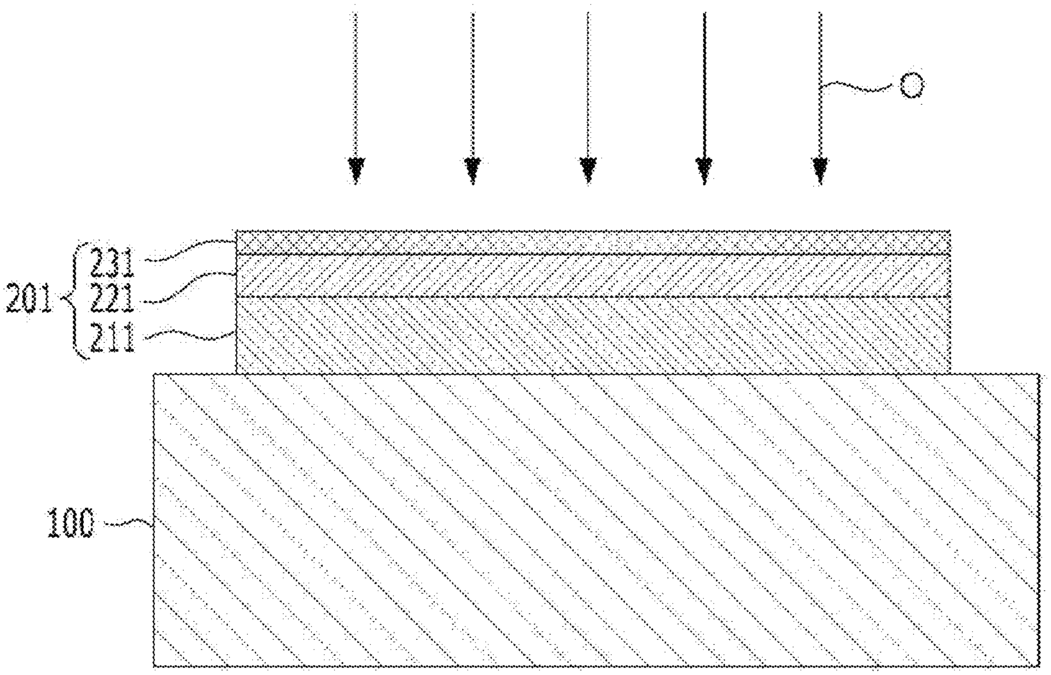

FIGS. 10 to 12 show the intermediate steps of the method for fabricating a surface acoustic wave device according to an embodiment of the present disclosure.

First, referring to FIG. 10, a piezoelectric substrate is prepared (S110). The piezoelectric substrate 100 may be a multilayer substrate that may include a plurality of layers. The plurality of layers may include, for example, a support substrate including silicon, a high acoustic velocity layer including a material such as amorphous silicon or polysilicon, a low acoustic velocity layer including a material such as silicon dioxide or aluminum nitride, and a piezoelectric layer including a material such as LT or LN and located on the low acoustic velocity layer to constitute the uppermost layer, but the present disclosure is not limited thereto. In some embodiments, the piezoelectric substrate 100 may be configured by omitting at least one of the high acoustic velocity layer and the low acoustic velocity layer.

The piezoelectric substrate 100 may be formed, for example, by sequentially forming the above-described high acoustic velocity layer, low acoustic velocity layer, and piezoelectric layer on the support substrate, or through a process of bonding at least one layer to other layers.

Referring to FIG. 11, an IDT electrode film 201 including a main electrode layer 211 and an upper electrode layer 221 is formed on the piezoelectric substrate 100 (S120). The main electrode layer 211 may be formed by RF sputtering or e-beam deposition of at least one metal material from, for example, aluminum (Al), copper (Cu), titanium (Ti), tungsten (W), molybdenum (Mo), platinum (Pt), gold (Au), and the like, and the upper electrode layer 221 may be formed by RF sputtering or e-beam deposition of, for example, titanium (Ti) or an alloy of titanium (Ti) and one or more metal materials.

Meanwhile, the fabrication method shown in FIG. 11 is to explain a subsequent conventional pattering process including forming a photoresist, patterned by exposure and development, on the IDT electrode film 201, and forming the IDT electrodes 200 using the photoresist as an etch mask. In some other embodiments, the fabrication method of the present disclosure may include forming the IDT electrodes 200 through a lift-off process. In this case, for the lift-off process, a photoresist patterned by exposure and development may be first formed on the piezoelectric substrate 100, and then the IDT electrode film 201 may be formed to cover the photoresist and the surface of the piezoelectric substrate 100 selectively exposed through the photoresist.

Referring to FIG. 12, the oxide electrode layer 231 is formed by oxidizing (0) the upper surface of the upper electrode layer 221 (S130). For example, the oxide electrode layer 231 may be formed through oxidation of the upper electrode layer 221 by irradiating the upper surface of the upper electrode layer 221 with an ion beam.

At this time, the scan rate (or dwell time) for ion beam irradiation may be controlled to control the thickness of the oxide electrode layer 231. Depending on the scan rate, the dwell time of the ion beam on one IDT electrode film 201 is determined, and thus the thickness of the oxide electrode layer 231 may also be controlled.

Referring to FIG. 1, the IDT electrodes 200 are formed by patterning the IDT electrode film 201 (S140). Patterning the IDT electrode film 201 may include, for example, etching the IDT electrode film 201 using the photoresist pattern, formed on the IDT electrode film 201, as an etch mask.

Alternatively, in the case of the lift-off process described above, the IDT electrodes 200 may be formed by removing the photoresist pattern, formed on the piezoelectric substrate 100, and a portion of the IDT electrode film 201 formed on the photoresist pattern.

Through the above-described fabrication process, it is possible to fabricate a surface acoustic wave device in which a number of characteristics of the filter, including the center frequency, have been controlled. In this case, the scan rate (or dwell time) of ion beam irradiation to form the oxide electrode layer 231 may be controlled so that the thickness ($t_o$) of the oxide electrode film 230 and the thickness ($t_e$) of the IDT electrode 200 can satisfy $0.011 \le t_o/t_e \le 0.333$.

Meanwhile, the surface acoustic wave device 20 according to another embodiment of the present disclosure as shown in FIG. 8 incudes the first IDT electrodes 200 and the second IDT electrodes 200, which are formed on the piezoelectric substrate 100 to have different thicknesses. To fabricate this surface acoustic wave device 20, the first and second IDT electrode films are formed to have different thicknesses in the first region and the second region, respectively, defined on the piezoelectric substrate 100, and oxidation processes on the IDT electrode films may be performed at different scan rates so that the first oxide electrode layer 230 and the second oxide electrode layer 330, which have different thicknesses, may be formed. In this case, the scan rate of ion beam irradiation to form the thickness ($t_{o1}$) of the first oxide layer 230 may be higher than the scan rate of ion beam irradiation to form the thickness ($t_{o2}$) of the second oxide electrode layer 330.

While the present disclosure has been described with reference to the particular illustrative embodiments, it will be understood by those skilled in the art to which the present disclosure pertains that the present disclosure may be embodied in other specific forms without departing from the technical spirit or essential characteristics of the present disclosure. Therefore, the embodiments described above are considered to be illustrative in all respects and not restrictive.

What is claimed is:

1. A surface acoustic wave device comprising:

a piezoelectric substrate; and a plurality of IDT electrodes formed on the piezoelectric substrate, wherein each of the plurality of IDT electrodes comprises:

a main electrode layer formed on an upper surface of the piezoelectric substrate;

an upper electrode layer formed on the main electrode layer; and an oxide electrode layer formed on an upper surface of the upper electrode layer by oxidation of the upper electrode layer, the oxide electrode layer comprising:

a first oxide electrode layer having a first density and forming an upper portion of the oxide electrode layer; and a second oxide electrode layer having a second density lower than the first density and located beneath the first oxide electrode layer;

wherein a thickness ($t_e$) of each of the plurality of IDT electrodes satisfies $0.011 \leq t_o/t_e \leq 0.333$ with respect to a thickness ($t_o$) of the oxide electrode layer.

2. The surface acoustic wave device according to claim 1, wherein the first oxide electrode layer is a native oxide layer, and the second oxide electrode layer is formed through an oxidation process by irradiating the upper electrode layer with an ion beam.

3. The surface acoustic wave device according to claim 1, wherein the upper electrode layer comprises titanium (Ti), and the oxide electrode layer comprises titanium oxide.

4. The surface acoustic wave device according to claim 1, wherein the upper electrode layer comprises aluminum (Al), and the oxide electrode layer comprises aluminum oxide.

5. The surface acoustic wave device according to claim 1, wherein the main electrode layer comprises at least one metal material selected from among aluminum (Al), copper (Cu), titanium (Ti), tungsten (W), molybdenum (Mo), platinum (Pt), and gold (Au).

6. A surface acoustic wave device comprising:

a piezoelectric substrate having a first region and a second region defined thereon;

a plurality of first IDT electrodes formed in the first region, wherein the plurality of first IDT electrodes corresponds to a first center frequency, and wherein each first IDT electrode has a first total thickness (te1) and comprises:

a first main electrode layer formed on an upper surface of the piezoelectric substrate in the first region;

a first upper electrode layer formed on the first main electrode layer; and a first oxide electrode layer formed on an upper surface of the first upper electrode layer by oxidation of the first upper electrode layer; and a plurality of second IDT electrodes formed in the second region, wherein the plurality of second IDT electrodes corresponds to a second center frequency lower than the first center frequency, and wherein each second IDT electrode has a second total thickness (te2) and comprises:

a second main electrode layer formed on an upper surface of the piezoelectric substrate in the second region;

a second upper electrode layer formed on the second main electrode layer; and a second oxide electrode layer formed on an upper surface of the second upper electrode layer by oxidation of the second upper electrode layer, wherein the first total thickness (te1) is smaller than the second total thickness (te2);

wherein a thickness (to1) of the first oxide electrode layer is smaller than a thickness (to2) of the second oxide electrode layer; and wherein a density of the first oxide electrode layer is greater than a density of the second oxide electrode layer.

7. The surface acoustic wave device according to claim 6, wherein the first total thickness (te1) satisfies $0.011 \leq t_{o1}/t_{e1} \leq 0.333$ with respect to the thickness ($t_{o1}$) of the first oxide electrode layer, and the second total thickness (te2) satisfies $0.011 \leq t_{o2}/t_{e2} \leq 0.333$ with respect to the thickness ($t_{o2}$) of the second oxide electrode layer.

8. A method for fabricating a surface acoustic wave device, comprising steps of:

preparing a piezoelectric substrate having a first region and a second region defined thereon;

forming an IDT electrode film comprising a main electrode layer and an upper electrode layer on the piezoelectric substrate, wherein forming the IDT electrode film comprises:

forming a first IDT electrode film in the first region to have a first thickness; and forming a second IDT electrode film in the second region to have a second thickness, wherein the first thickness and the second thickness are different from each other;

forming an oxide electrode layer by oxidizing an upper surface of the upper electrode layer, wherein forming the oxide electrode layer comprises:

forming a first oxide electrode layer by irradiating an upper surface of a first upper electrode layer comprised in the first IDT electrode film with an ion beam at a first scan rate; and forming a second oxide electrode layer by irradiating an upper surface of a second upper electrode layer comprised in the second IDT electrode film with an ion beam at a second scan rate different from the first scan rate; and forming IDT electrodes by patterning the IDT electrode film.

9. The method according to claim 8, wherein the step of forming the oxide electrode layer by oxidizing the upper surface of the upper electrode layer comprises a step of forming the oxide electrode layer by irradiating the upper electrode layer with an ion beam.

10. The method according to claim 8, wherein;

the thickness of the first IDT electrode and the thickness of the first oxide electrode layer are smaller than the thickness of the second IDT electrode and the thickness of the second oxide electrode layer, respectively;

the first IDT electrode corresponds to a first center frequency; and the second IDT electrode corresponds to a second center frequency lower than the first center frequency.

11. The method according to claim 10, wherein a density of the first oxide electrode layer is greater than a density of the second oxide electrode layer.

12. The method according to claim 8, wherein the upper electrode layer comprises titanium (Ti), and the oxide electrode layer comprises titanium oxide.

13. The method according to claim 8, wherein the upper electrode layer comprises aluminum (TiAl), and the oxide electrode layer comprises aluminum oxide.

14. The method according to claim 8, wherein the main electrode layer comprises at least one metal material selected from among aluminum (Al), copper (Cu), titanium (Ti), tungsten (W), molybdenum (Mo), platinum (Pt), and gold (Au).

* * * * *